US008406062B2

(12) United States Patent
Seol et al.

(10) Patent No.: US 8,406,062 B2
(45) Date of Patent: Mar. 26, 2013

(54) CHARGE RECYCLING MEMORY SYSTEM AND A CHARGE RECYCLING METHOD THEREOF

(75) Inventors: Kwnag Soo Seol, Yongin-si (KR); Jungdal Choi, Hwaseong-si (KR); Sunghoi Hur, Seoul (KR)

(73) Assignee: Samsung Electronics Co., Ltd., Suwon-Si, Gyeonggi-do (KR)

( * ) Notice: Subject to any disclaimer, the term of this patent is extended or adjusted under 35 U.S.C. 154(b) by 240 days.

(21) Appl. No.: 12/917,072

(22) Filed: Nov. 1, 2010

(65) Prior Publication Data

US 2011/0116322 A1     May 19, 2011

(30) Foreign Application Priority Data

Nov. 16, 2009    (KR) ........................ 10-2009-0110472

(51) Int. Cl.
*G11C 11/34* (2006.01)
*G11C 16/04* (2006.01)
*G11C 16/06* (2006.01)
(52) U.S. Cl. .............................. 365/185.25; 365/185.28
(58) Field of Classification Search ............. 365/185.25, 365/185.28
See application file for complete search history.

(56) References Cited

U.S. PATENT DOCUMENTS

| 6,603,702 B2* | 8/2003 | Kojima ................. 365/230.06 |
| 7,715,267 B2* | 5/2010 | Chen et al. .................... 365/227 |
| 2003/0107932 A1* | 6/2003 | Komura ....................... 365/203 |
| 2009/0231919 A1* | 9/2009 | Won et al. ................. 365/185.13 |
| 2009/0303819 A1* | 12/2009 | Park et al. .................... 365/203 |

FOREIGN PATENT DOCUMENTS

| JP | 2004-032919 | 1/2004 |
| JP | 2004-164775 | 6/2004 |
| KR | 1020020051177 | 6/2002 |
| KR | 10-2009-0130758 | 12/2009 |

* cited by examiner

*Primary Examiner* — Ly D Pham
(74) *Attorney, Agent, or Firm* — F. Chau & Associates, LLC

(57) ABSTRACT

A memory system, including a nonvolatile memory device, a charge recycler configured to discharge charges from the nonvolatile memory device and recycle the discharged charges, and a controller configured to control the nonvolatile memory device and the charge recycler, wherein the controller controls the charge recycler to recycle the discharged charges, wherein during the recycling the charge recycler charges the charges discharged from the nonvolatile memory device.

18 Claims, 12 Drawing Sheets

CHARGE RECYCLING MEMORY SYSTEM AND A CHARGE RECYCLING METHOD THEREOF

CROSS-REFERENCE TO RELATED APPLICATION

This U.S. non-provisional patent application claims priority under 35 U.S.C. §119 to Korean Patent Application No. 10-2009-0110472, filed on Nov. 16, 2009, the disclosure of which is incorporated by reference herein in its entirety.

BACKGROUND

1. Technical Field

The present inventive concept relates to memory systems and, more specifically, to a memory system for recycling discharged charges of a memory device.

2. Description of Related Art

Nonvolatile memory devices are electrically erasable and programmable and can retain their stored data even when their power supplies are interrupted. Nonvolatile memory devices include flash memory devices, variable resistance memory devices, and the like. Flash memory devices may be classified into NAND flash memory devices and NOR flash memory devices. A NOR flash memory device includes a plurality of memory cells each being independently connected to a bitline and a wordline. Accordingly, NOR flash memory devices exhibit excellent random access time characteristics.

A NAND flash memory device includes a plurality of memory cells connected in series. This structure is called a cell string, and requires one bitline contact per cell string. Accordingly, NAND flash memory devices exhibit high integration characteristics. Due to the high integration characteristics, NAND flash memory devices are widely used as data storage for various applications such as MP3 players, various types of memory cards, and solid-state drives (SSDs).

A memory system uses a plurality of memory devices to increase data storage capacity. When a plurality of memory devices operate in parallel to improve the speed of a memory system, power consumption of the memory system may increase significantly. Although memory devices with low power consumption characteristics have been used to reduce power consumption of a memory system, power consumption of memory devices is increasing due to increasingly higher levels of device integration.

A power management algorithm may be used to reduce power consumption of a memory system. However, there is still a need to reduce power consumption of a memory system.

SUMMARY

The present inventive concept provides a memory system. In an exemplary embodiment of the inventive concept, the memory system may include a nonvolatile memory device, a charge recycler configured to discharge charges from the nonvolatile memory device and recycle the discharged charges, and a controller configured to control the nonvolatile memory device and the charge recycler. The controller controls the charge recycler to recycle the discharged charges, wherein during the recycling the charge recycler charges the charges discharged from the nonvolatile memory device.

In an exemplary embodiment of the inventive concept, the nonvolatile memory device may include a plurality of memory cells, a data input/output circuit connected to the memory cells through a bitline, and a control logic configured to control the data input/output circuit such that charges precharged to the bitline are discharged to the charge recycler.

In an exemplary embodiment of the inventive concept, the data input/output circuit may include a precharge circuit configured to precharge the bitline and a discharge circuit configured to discharge the bitline.

In an exemplary embodiment of the inventive concept, the bitline may be precharged with a predetermined voltage through the precharge circuit during a program operation of the nonvolatile memory device. The bitline is selected according to data input to the data input/output circuit.

In an exemplary embodiment of the inventive concept, the charges are discharged after a program operation of the nonvolatile memory device is completed.

In an exemplary embodiment of the inventive concept, the charges discharged from the nonvolatile memory device may be transferred to the charge recycler through a charge collecting line.

In an exemplary embodiment of the inventive concept, a charging operation of the charge recycler may be started before a program operation of the nonvolatile memory device is completed.

In an exemplary embodiment of the inventive concept, a voltage supplied from the charge recycler may be greater than a discharge voltage of the nonvolatile memory device.

In an exemplary embodiment of the inventive concept, the charged charges may be provided to the nonvolatile memory device through a charge supply line.

In an exemplary embodiment of the inventive concept, the nonvolatile memory device may include a voltage generator. The voltage generator applies a voltage to a wordline or a bitline of the nonvolatile memory device by using the charged charges provided from the charge recycler.

In an exemplary embodiment of the inventive concept, the memory system may further include a power supply. The charged charges are provided to the power supply from the charge recycler through a charge supply line.

In an exemplary embodiment of the inventive concept, the memory system may be included a solid state drive (SSD) including a plurality of nonvolatile memory devices.

In an exemplary embodiment of the inventive concept, the nonvolatile memory device includes a floating gate.

In an exemplary embodiment of the inventive concept, the discharged charges are negative charges.

The present inventive concept also provides a method of recycling charges in a memory system, the memory system including nonvolatile memory devices, a charge recycler, and a controller configured to control the nonvolatile memory devices and the charge recycler. In an exemplary embodiment of the inventive concept, the method may include performing operations with the nonvolatile memory devices, colleting and charging, at the charge recycler, charges discharged from the nonvolatile memory devices, and providing, from the charge recycler, the charged charges to the nonvolatile memory devices.

In an exemplary embodiment of the inventive concept, collecting charges discharged from the nonvolatile memory devices may be started before operations involving the nonvolatile memory devices are completed.

In an exemplary embodiment of the inventive concept, the nonvolatile memory devices may discharge charges that were precharged to an external entity of the nonvolatile memory devices during a program operation.

In an exemplary embodiment of the inventive concept, the charged charges may be provided to the nonvolatile memory device that discharged charges that were precharged thereto.

In an exemplary embodiment of the inventive concept, a nonvolatile memory device that discharged charges that were precharged thereto may be different from a nonvolatile memory device to which the charged charges are provided.

In an exemplary embodiment of the inventive concept, the charged charges may be provided to a power supply of the memory system.

The present inventive concept also provides a nonvolatile memory system that may include a plurality of flash memory devices each including a memory cell array; a charge recycler connected to the flash memory devices, the charge recycler including a plurality of capacitors configured to store charges released from unselected bit lines of the flash memory devices, the unselected bit lines being those not involved in a read, write or erase operation performed by the flash memory devices, the charge recycler further including a plurality of transistors respectively coupled to the capacitors, the transistors configured to cause the stored charges to be released from the capacitors; and a voltage generator included in each of the flash memory devices, the voltage generator configured to receive the charges released from the capacitors and use the received charges in conjunction with a power supply voltage to generate a bias voltage to be provided to a bit line or word line of the memory cell arrays.

BRIEF DESCRIPTION OF THE DRAWINGS

The above and other features of the inventive concept will become more apparent by describing in detail exemplary embodiments thereof with reference to the attached drawings. In the drawings, like reference numerals may refer to the same or similar elements.

DETAILED DESCRIPTION OF THE EMBODIMENTS

Exemplary embodiments of the inventive concept will now be described in detail with reference to the accompanying drawings. The inventive concept may, however, be embodied in many alternate forms and should not be construed as limited to only the exemplary embodiments set forth herein.

It will be understood that when an element is referred to as being "connected" or "coupled" to another element, it may be directly connected or coupled to the other element or intervening elements may be present.

Figure 1:
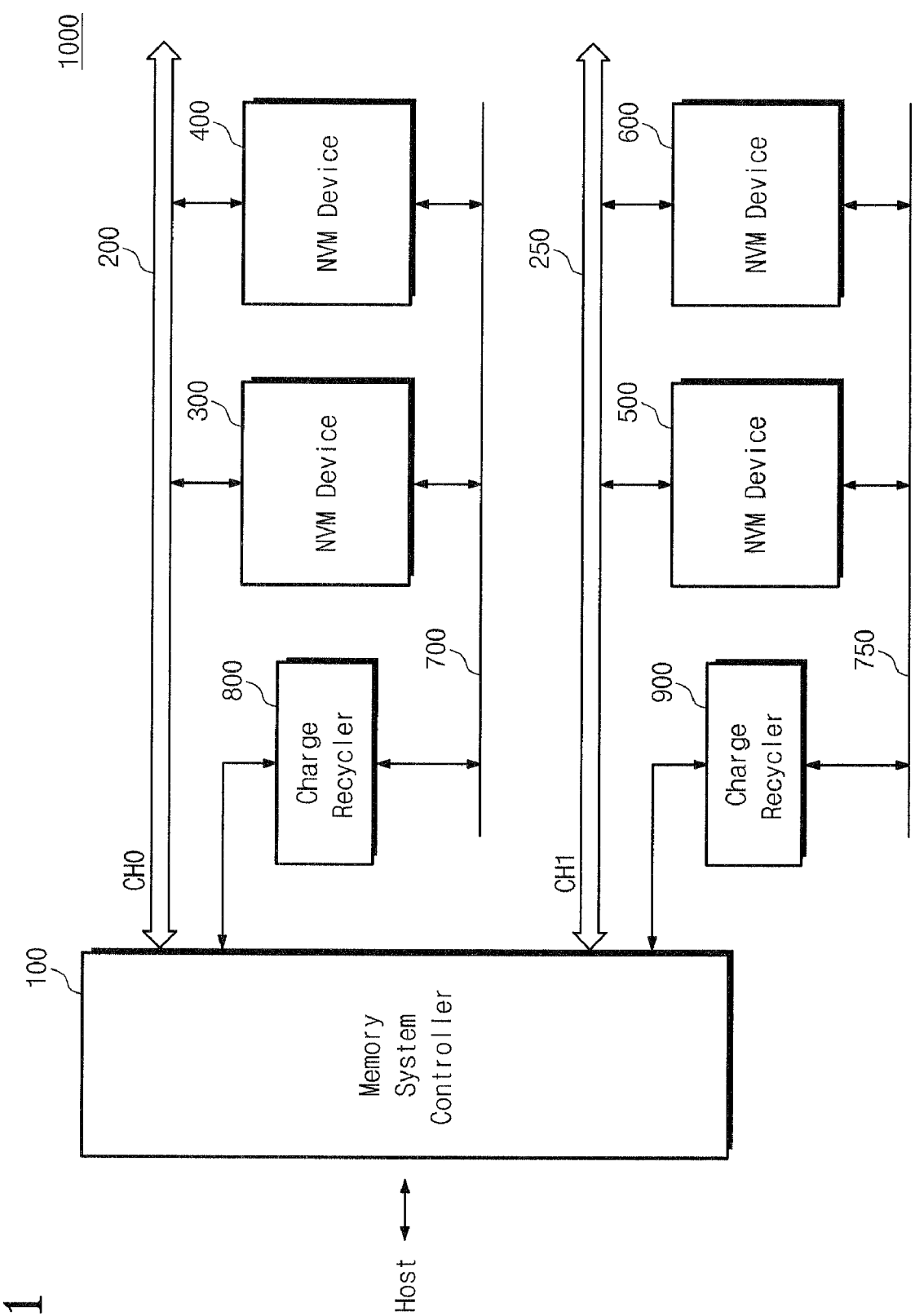
FIG. 1 illustrates a nonvolatile memory system according to an exemplary embodiment of the inventive concept.

FIG. 1 illustrates a nonvolatile memory system 1000 according to an exemplary embodiment of the inventive concept. For brevity of description, it is assumed that the nonvolatile memory system 1000 includes four memory devices; however, the nonvolatile memory system 1000 is not limited thereto.

As illustrated, the nonvolatile memory system 1000 includes a memory system controller 100, a plurality of channels 200 and 250, a plurality of nonvolatile memory devices 300, 400, 500, and 600, charge recycle lines 700 and 750, and charge recyclers 800 and 900.

The memory system controller 100 operates the nonvolatile memories 300, 400, 500, and 600 in parallel to process a command requested from a host system at high speed. When the nonvolatile memories 300, 400, 500, and 600 operate in parallel, power consumption of the nonvolatile memory system 1000 may increase significantly. Therefore, the memory system controller 100 controls the charge recyclers 800 and 900 to collect and charge charges discharged from the nonvolatile memories 300, 400, 500, and 600 after a write operation is completed. In addition, the memory system controller 100 controls the charge recyclers 800 and 900 to provide the charged charges to the nonvolatile memories 300, 400, 500, and 600.

The memory system controller 100 and the nonvolatile memories 300, 400, 500, and 600 are connected to the channels 200 and 250. For example, the nonvolatile memory system 1000 includes a channel CH0 to which the nonvolatile memories 300 and 400 are connected and a channel CH1 to which the nonvolatile memories 500 and 600 are connected. A channel may comprise a data bus and a control bus. Accordingly, each of the nonvolatile memories 300 and 400 connected to the channel CH0 or each of the nonvolatile memories 500 and 600 connected to the channel CH1 shares a data signal and a control signal with the memory system controller 100.

The nonvolatile memories 300, 400, 500, and 600 store data or output stored data to an external entity in compliance with the control of the memory system controller 100. The nonvolatile memory devices 300, 400, 500, and 600 according to an exemplary embodiment of the inventive concept may be flash memories, respectively, and may be interchangeably referred to as such hereinafter. However, it will be understood that the nonvolatile memory devices 300, 400, 500, and 600 are not limited to flash memories. For example, each of the nonvolatile memory devices 300, 400, 500, and 600 may be a nonvolatile memory device such as a NOR-flash memory, a phase-change RAM (PRAM), and a magnetic RAM (MRAM). The flash memories 300, 400, 500, and 600 may each be organized with the same structure and configured to perform the same operations. Therefore, for brevity of description, exemplary embodiments of the inventive concept will be described with respect to the flash memory device 300.

During a write operation, the flash memory 300 precharges unselected bitlines to prevent an unselected memory cell from being programmed. When the program operation is completed, the flash memory 300 selectively discharges charges (e.g., the discharged charges may be negative charges) that were precharged to a bitline to a ground line or the charge recycle line 700 through a discharge circuit. When the charges are discharged to the charge recycle line 700, they are transferred to the charge recycle line 700 through an external connector (e.g., a pin or ball according to the type of package) of the flash memory 300. The above operation will be described in detail later with reference to FIG. 3.

The charge recycler 800 and the flash memories 300 and 400 are connected to the charge recycle line 700, and the charge recycler 900 and the flash memories 500 and 600 are connected to the charge recycle line 750. The charge recycle lines 700 and 750 include a charge collecting line configured to collect charges to be recycled and a charge supply line configured to supply recycled charges. Each of the charge collecting line and the charge supply line may include a plurality of lines. The charge collecting line functions as a path along which charges discharged from a bitline of the flash memory 300 are transferred to the charge recycler 800. The charge supply line functions as a path along which charges charged by the charge recycler 800 are transferred to the flash memory 300.

The charge recycler 800 is connected to the charge recycle line 700, and the charge recycler 900 is connected to the charge recycle line 750. The charge recyclers 800 and 900 may each be organized with the same structure and configured to perform the same operations. Therefore, for brevity of description, the charge recycler 800 will be described as an example. After collecting and charging charges released from the flash memory 300, the charge recycler 800 supplies the charged charges to the flash memory 300.

Figure 2:
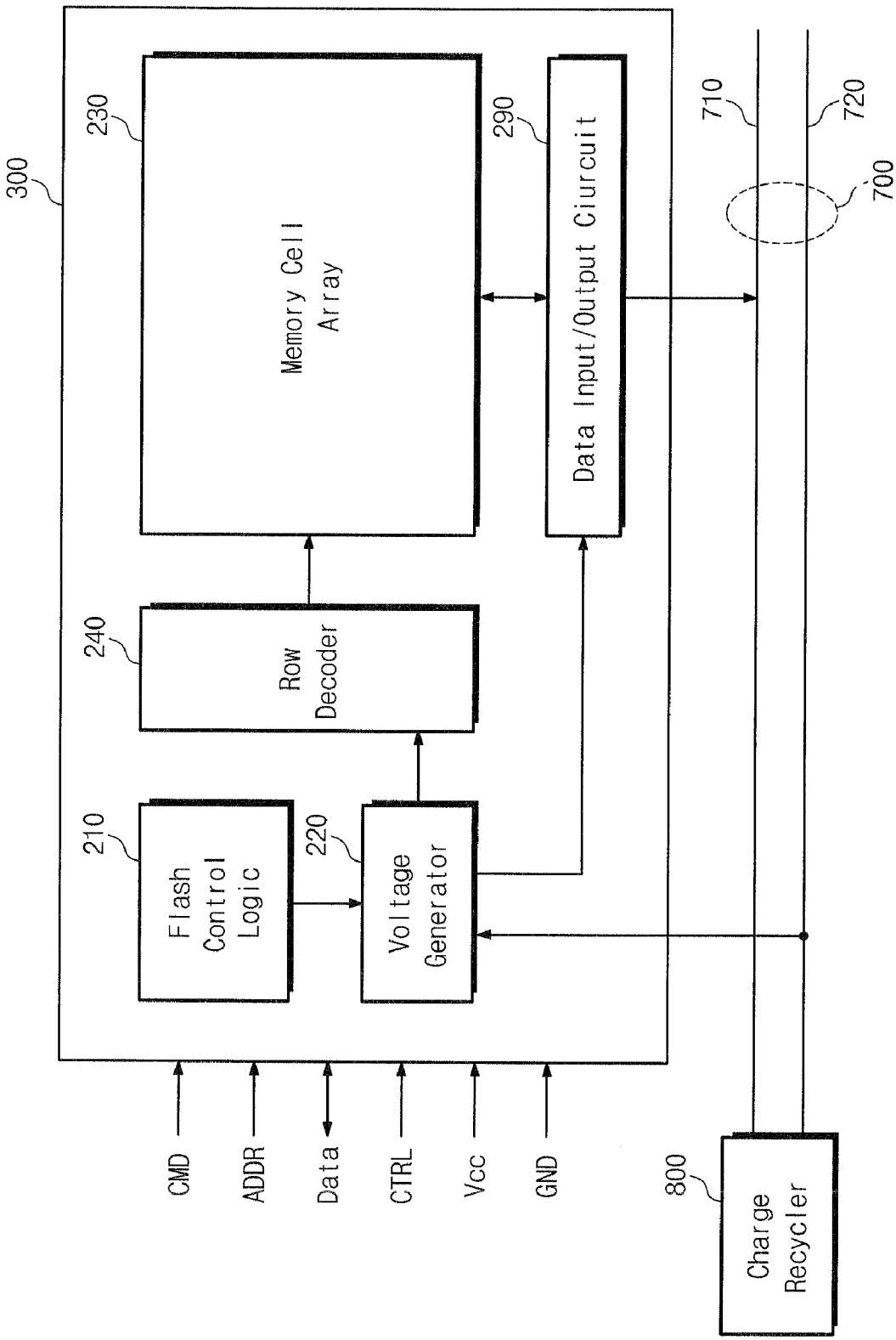
FIG. 2 is a block diagram of a flash memory according to an exemplary embodiment of the inventive concept.

FIG. 2 is a block diagram of a flash memory 300 according to an exemplary embodiment of the inventive concept. As illustrated, the flash memory 300 includes a flash control logic 210, a voltage generator 220, a memory cell array 230, a row decoder 240, and a data input/output circuit 290.

The flash control logic 210 controls read, write, and erase operations of the flash memory device 300 in response to a command CMD, an address ADDR, and a control signal CTRL provided from a memory system controller (e.g., 100 in FIG. 1). The flash control logic 210 controls elements (e.g., a voltage generator, a row decoder, and a data input/output circuit) according to a command provided from the memory system controller (e.g., 100 in FIG. 1).

According to an exemplary embodiment of the inventive concept, the flash control logic 210 selectively generates a control signal for discharging a charge from a bitline after a write operation is completed. As an example, the flash control logic 210 provides the data input/output circuit 290 with a control signal for releasing charges discharged from a bitline to a ground line. As another example, the flash memory control logic 210 provides the data input/output circuit 290 with a control signal for releasing charges discharged from a bitline to an external entity of the flash memory 300.

The voltage generator 220 generates a bias voltage to be provided to a wordline or a bitline in compliance with the control of the flash control logic 210 during read, write, and erase operations. The voltage generator 220 generates the bias voltage based on a power supply voltage $V_{CC}$ provided to the flash memory 300. As an example, during a read operation, the voltage generator 220 generates a predetermined voltage for precharging an unselected bitline. The generated precharge voltage is applied to the unselected bitline to prevent an unselected memory cell from being programmed. As another example, during a write operation, the voltage generator 220 generates a voltage for boosting a provided power supply voltage (e.g., $V_{CC}$) to program a selected memory cell. The generated program voltage is applied to a selected wordline.

According to an exemplary embodiment of the inventive concept, the voltage generator 220 generates a bias voltage using a power supply voltage $V_{CC}$ and a recycled power made from discharged charges, the recycled power being provided from the charge recycler 800 in compliance with the control of the flash control logic 210. For example, the voltage generator 220 receives a power supply voltage $V_{CC}$ and receives a recycled power provided from the charge recycler 800 through a charge supply line 720. The voltage generator 220 uses the received two powers as a power for generating a bias voltage. The above operation will be described in detail later with reference to FIG. 8.

The memory cell array 230 includes memory cells to store data. Each of the memory cells may store single-bit data or multi-bit data. The memory cells are configured and managed by a page unit that is a write unit or a block unit that is an erase unit. The row decoder 240 is connected to the memory cell array 230 through a plurality of wordlines. The row decoder 240 selects a memory block or page based on an input address ADDR in compliance with the control of the flash control logic 210. The row decoder 240 transfers a wordline bias voltage provided from the voltage generator 220 to the selected memory block or page.

The data input/output circuit 290 reads data stored in the memory cell array 230 or stores data in the memory cell array 230 in compliance with the control of the flash control logic 210. During a write operation, the data input/output circuit 290 controls a selected bitline to which a memory cell to be programmed is connected and an unselected bitline to which a memory cell to be program-inhibited is connected, in compliance with the control of the flash control logic 210. For example, the data input/output circuit 290 applies a voltage provided from the voltage generator 220 to the unselected bitline. When the unselected bitline is precharged with the provided voltage, a cell string connected to the unselected bitline undergoes a local self-boosting phenomenon. Memory cells connected to the cell string undergoing the local self-boosting phenomenon are not programmed. When a program operation is completed, the data input/output circuit 290 discharges charges precharged to the unselected bitline in compliance with the control of the flash control logic 210. At this point, the discharged charges are released to a charge collecting line 710.

Figure 3:
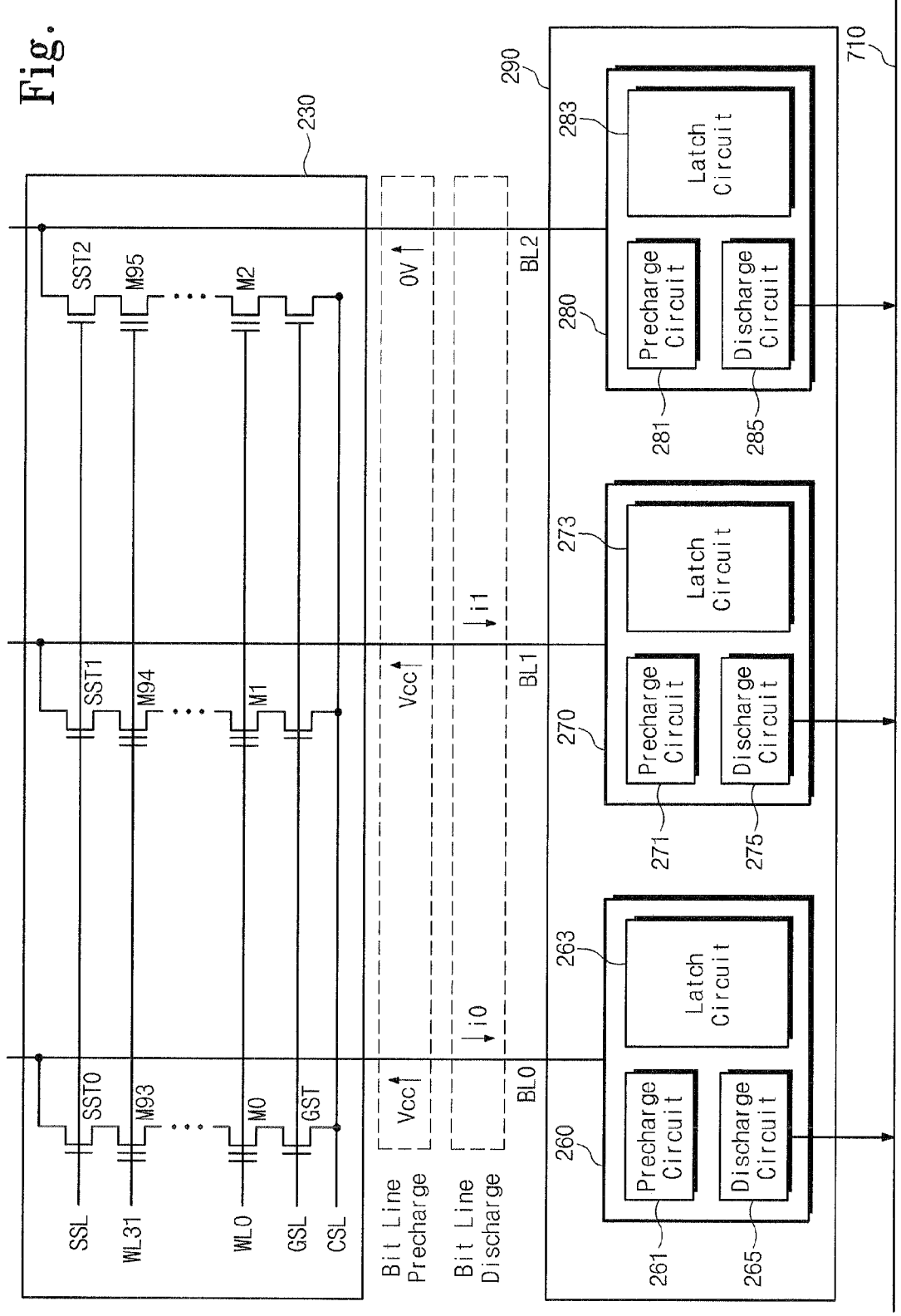
FIG. 3 illustrates a memory cell array and a data input/output circuit according to an exemplary embodiment of the inventive concept.

FIG. 3 illustrates a memory cell array 230 and a data input/output circuit 290 according to an exemplary embodiment of the inventive concept. As illustrated, the memory cell array 230 includes a plurality of memory blocks. In FIG. 3, a memory block including three bitlines is shown. The memory block includes a plurality of cell strings each including a plurality of memory cells coupled between a bitline and a common source line CSL. Each of the cell strings includes a string select transistor SST connected to a string select line SSL, a plurality of memory cells connected to a plurality of wordlines WL0~WL31, and a ground select transistor GST connected to a ground select line GSL.

The data input/output circuit 290 includes data input/output circuits 260, 270, and 280 corresponding to a plurality of bitlines BL0~BL2. The data input/output circuits 260, 270, and 280 are connected to the memory cell array 230 through the bitlines BL0~BL2, respectively. The data input/output circuit 290 outputs and receives data through a data input/output line (not shown). Specifically, the data input/output circuit 290 reads out data stored in a selected one of the memory cells through the bitlines BL0~BL2, and outputs the read-out data to an external entity of a flash memory through the data input/output line. In addition, the data input/output circuit 290 temporarily stores data to be programmed to the selected memory cell. The data stored in the data input/output circuit 290 is programmed to a corresponding memory cell during a program operation.

Each of the data input/output circuits 260, 270, and 280 includes a precharge circuit, a latch circuit, and a discharge circuit. During a write operation, in compliance with the control of a flash control logic (e.g., 210 in FIG. 2), the data input/output circuit 280 controls a selected bitline BL2 to which a memory cell M2 to be programmed is connected and the data input/output circuits 260 and 270 control unselected bitlines BL0 and BL1 to which memory cells M0 and M1 to be program-inhibited are connected, respectively.

For example, the data input/output circuit 280 applies a voltage of 0 volts to the selected bitline BL2 in compliance with the control of the flash control logic (e.g., 210 in FIG. 2) during a write operation. In other words, the data input/output circuit 280 does not apply a voltage. On the other hand, the data input/output circuits 260 and 270 apply a power supply voltage $V_{CC}$ supplied from a voltage source to the unselected bitlines BL0 and BL1, respectively, during the write operation. The power supply voltage $V_{CC}$ is applied by precharge circuits 261 and 271 in compliance with the control of the flash control logic (e.g., 210 in FIG. 2). An operation of controlling the selected bitline BL2 and the unselected bitlines BL0 and BL1 may be determined according to values of write data input to latch circuits 263, 273, and 283.

The unselected bitlines BL0 and BL1 are precharged by the precharge circuits 261 and 271, respectively. After the respective bitlines BL0~BL2 are controlled, a predetermined voltage is applied to a string select line SSL and unselected wordlines WL1~WL31 through a row decoder (e.g., 240 in FIG. 2). Accordingly, memory cells and transistors connected to the string select line SSL and unselected wordlines WL1~WL31 are turned on to cause a voltage at the level of the precharged charges to be present at source regions, drain regions, and channel regions of the memory cells (e.g., M93~M95).

At this point, if a difference between voltages of a gate and a source region of string select transistors SST0 and SST1 becomes smaller than a threshold voltage of the string select transistors SST0 and SST1, the string select transistors SST0 and SST1 are turned off. After the string select transistors SST0 and SST1 are turned off, a program voltage is applied through a row decoder (e.g., 240 in FIG. 2) to a wordline WL0 to which the memory cell M2 to be programmed is connected. When the program voltage is applied to the selected wordline WL0, the memory cell M2 is programmed. In the meantime, memory cells M0 and M1 connected to precharged unselected bitlines BL0 and BL1 are not programmed because a channel voltage rises due to local self-boosting.

When a program operation is completed, the data input/output circuits 260 and 270 discharge the charges precharged to the unselected bitlines BL0 and BL1 in compliance with the control of the flash control logic (e.g., 210 in FIG. 2). The discharge operation is performed by discharge circuits 265 and 275. Discharge currents i0 and i1 are generated due to the discharged charges. The discharge currents i0 and it are emitted to the charge collecting line 710 through an external connector (e.g., a pin or ball according to the type of package) of the flash memory 300.

Figure 4:
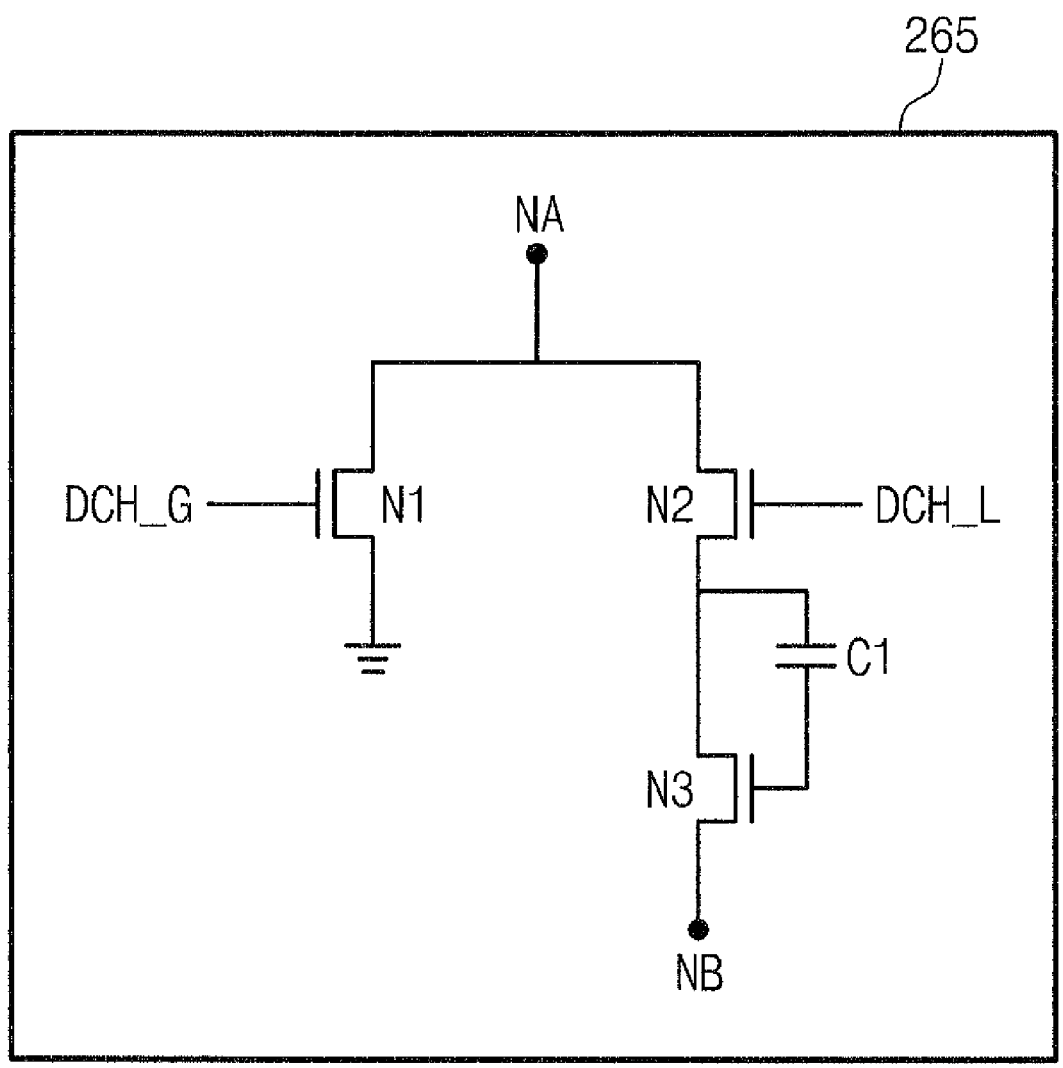
FIGS. 4 and 5 illustrate the configuration and operations of a discharge circuit according to an exemplary embodiment of the inventive concept, respectively.
Figure 5:
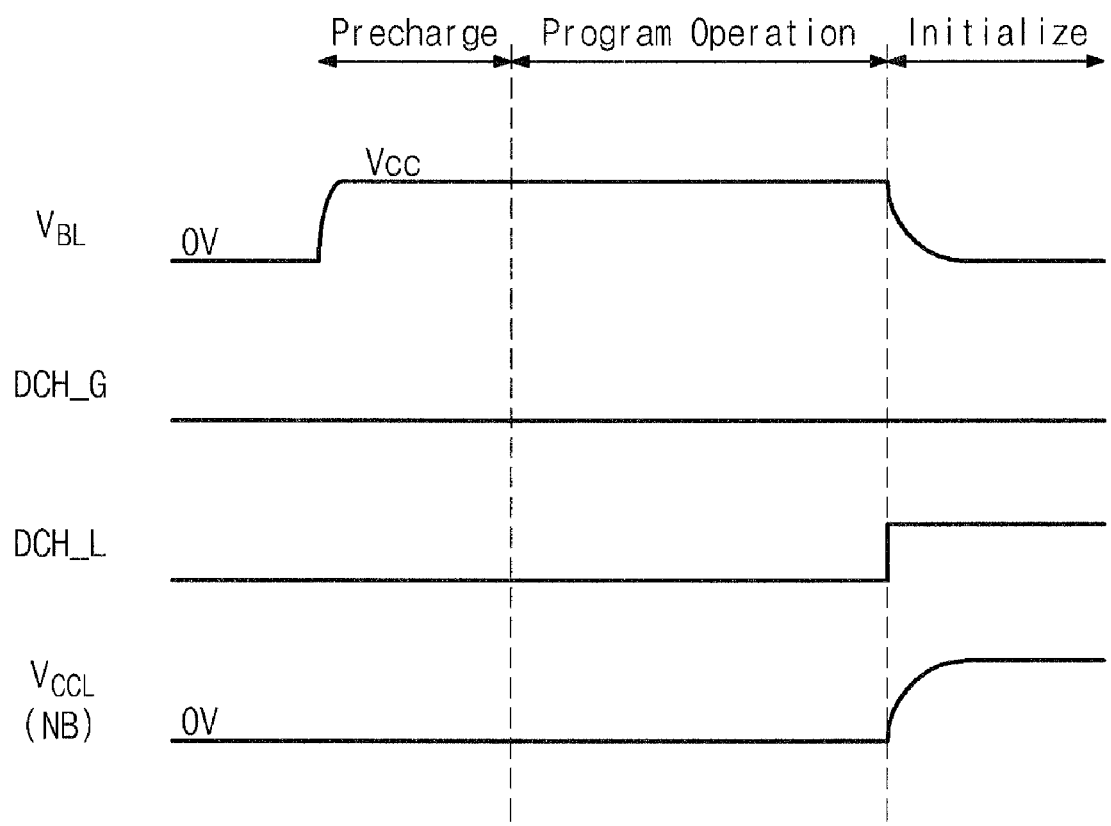

FIGS. 4 and 5 illustrate the configuration and operations of a discharge circuit according to an exemplary embodiment of the inventive concept, respectively. Discharge circuits 265, 275, and 285 may each be organized with the same structure and configured to perform the same operations. Therefore, for brevity of description, exemplary embodiments of the inventive concept will be described with respect to the discharge circuit 265.

Referring to FIG. 4, the discharge circuit 265 includes transistors N1~N3 and a capacitor C1. A node A (NA) is connected to a precharge circuit (e.g., 261 in FIG. 3) or a latch circuit (e.g., 263 in FIG. 3). A node B (NB) is connected to a charge collecting line (e.g., 710 in FIG. 3). Current input to the node A (NA) from a bitline is discharged to a ground through the transistor N1 or the charge collecting line (e.g., 710 in FIG. 3) through the transistor N2 in compliance with the control of a flash control logic (e.g., 210 in FIG. 2). A discharge passage is determined by a control signal of the flash control logic (e.g., 210 in FIG. 2) according to an operation mode of the flash memory 300.

Referring to FIG. 5, operations of the discharge circuit 265 during a program operation will now be described. An unselected bitline is precharged with a power supply voltage $V_{CC}$ during a precharge period. A precharge voltage (e.g., the power supply voltage $V_{CC}$) of the unselected bitline is maintained until the completion of the program operation such that unselected program cells are program-inhibited. While the program operation is completed to initialize all operations of the flash memory 300, charges precharged to the unselected bitline are discharged through the discharge circuit 265.

For example, during the initialization, the flash control logic 210 activates a control signal DCH_L (e.g., sets the control signal DCH_L to logic '1'). When the control signal DCH_L is activated, transistors N2 and N3 are turned on. At this point, current input from the transistor N2 charges the capacitor C1. The charged capacitor C1 may provide a gate voltage of the transistor N3 to fully turn on the transistor N3. When the transistors N2 and N3 are turned on, the charges precharged to the unselected bitline are discharged to a charge collecting line through the node B (NB). Thus, a voltage of the charge collecting line rises.

While the discharge operation is performed to the charge collecting line, the flash control logic 210 deactivates a control signal DCH_G (e.g., sets the control signal DCH_G to logic '0') such that the charges precharged to the unselected bitline are released to the node B (NB). When the control signal DCH_G is deactivated, the transistor N1 is turned off to block a path between the node A (NA) and a ground. Since a gate of the transistor N3 and a drain of the transistor N3 are connected, the transistor N3 may function as a diode to prevent charges from flowing back to the discharge circuit 265 from the charge collecting line.

Figure 6:
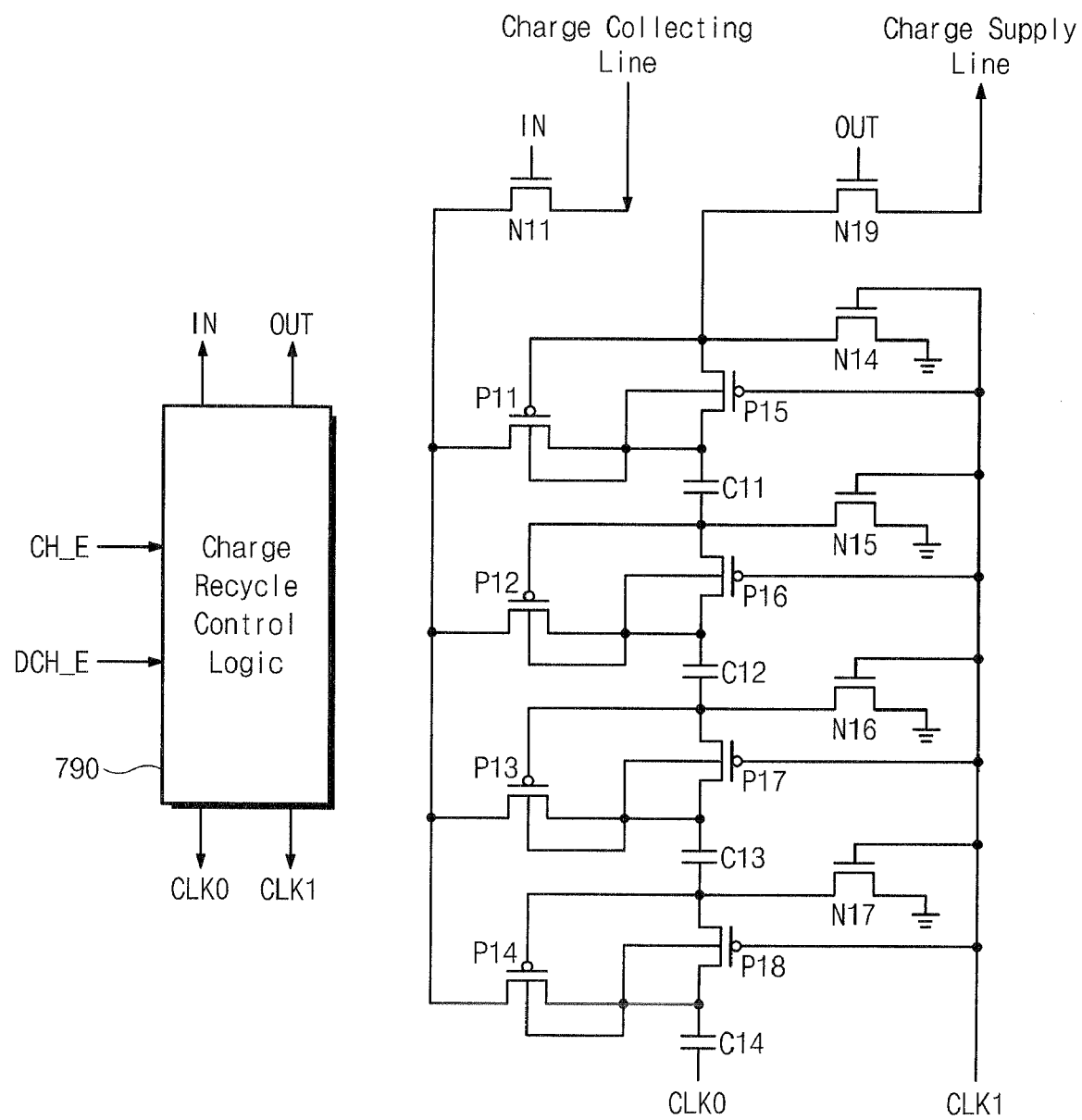
FIGS. 6 to 7B illustrate the configuration and operations of a charge recycler according to an exemplary embodiment of the inventive concept.

FIG. 6 illustrates operations of a charge recycler 800 according to an exemplary embodiment of the inventive concept. As illustrated, the charge recycler 800 includes a charge recycle control logic 790, a plurality of capacitors C11~C14 for charging charges, and a plurality of transistors N11, N14~N17, N19 and P11~P18. The charge recycler 800 charges discharged charges transferred through a charge collecting line (e.g., 710 in FIG. 2) according to a control signal of a memory system controller (e.g., 100 in FIG. 1). In addition, the charge recycler 800 supplies the charged charges to the flash memory 300 through a charge supply line (e.g., 720 in FIG. 2) according to the control signal of the memory system controller (e.g., 100 in FIG. 1).

Figure 7A:
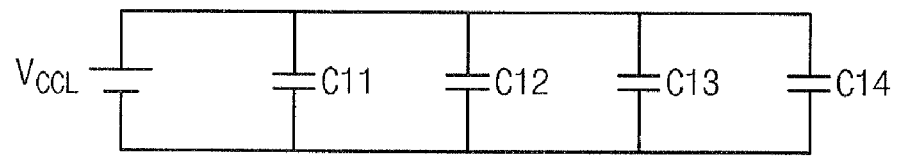

A charging operation of the charge recycler 800 will now be described with reference to FIGS. 6 and 7A. During an initializing operation of the flash memory 300, the memory system controller (e.g., 100 in FIG. 1) provides a charge control signal CH_E to the charge recycle control logic 790. The charge recycle control logic 790 activates a control signal IN (e.g., sets the control signal IN to logic '1') to turn on the transistor N11 connected to a charge collecting line. In addition, the charge recycle control logic 790 deactivates a control signal CLK0 (e.g., sets the control signal CLK0 to logic '0') and activates a control signal CLK1 (e.g., sets the control signal CLK1 to logic '1') to charge capacitors C11~C14.

According to the applied control signals, the transistor N11 is turned on and transistors N14~N17 and P11~P18 are turned on or off. Thus, the capacitors C11~C14 are connected in parallel to the charge collecting line. The charges supplied from the charge collecting line through the transistor N11 are charged to the capacitors C11~C14.

Figure 7B:
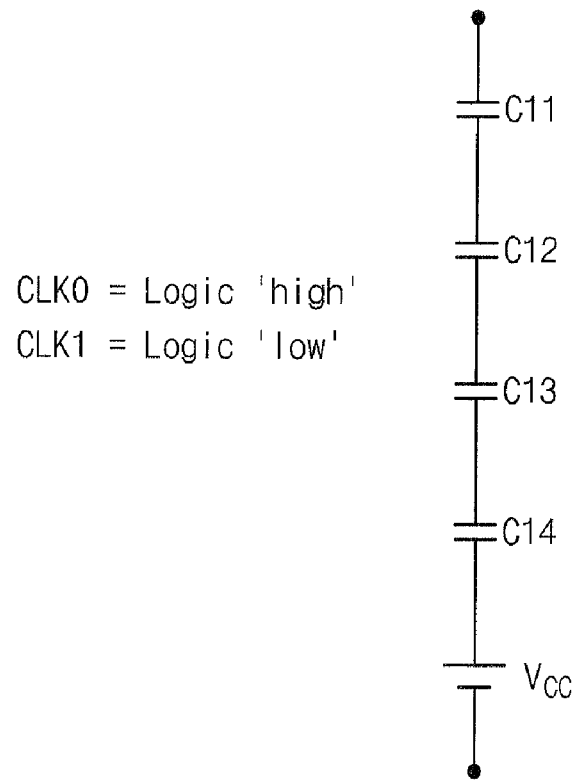

A discharging operation of the charge recycler 800 will now be descried with reference to FIGS. 6 and 7B. A memory system controller (e.g., 100 in FIG. 1) provides a discharge control signal DCH_E to the charge recycle control logic 790. In response to the discharge control signal DCH_E, the charge recycle control logic 790 activates a control signal OUT (e.g., sets the control signal OUT to logic '1') to turn on the transistor N19 connected to a charge supply line. In addition, the charge recycle control logic 790 activates a control signal CLK0 (e.g., sets the control signal CLK0 to logic '1') to discharge the capacitors C11~C14 and deactivates a control signal CLK1 (e.g., sets the control signal CLK1 to logic '0'). According to the applied control signals, the transistor N19 is turned on and transistors N14~N17 and P11~P18 are turned off or on. Thus, the capacitors C11~C14 are connected in series to the charge supply line. The charges charged to a capacitor are discharged to the charge supply line through the transistor N19. The charges discharged to the charge supply line are thus recycled and provided to a voltage generator of the flash memory 300.

Figure 8:
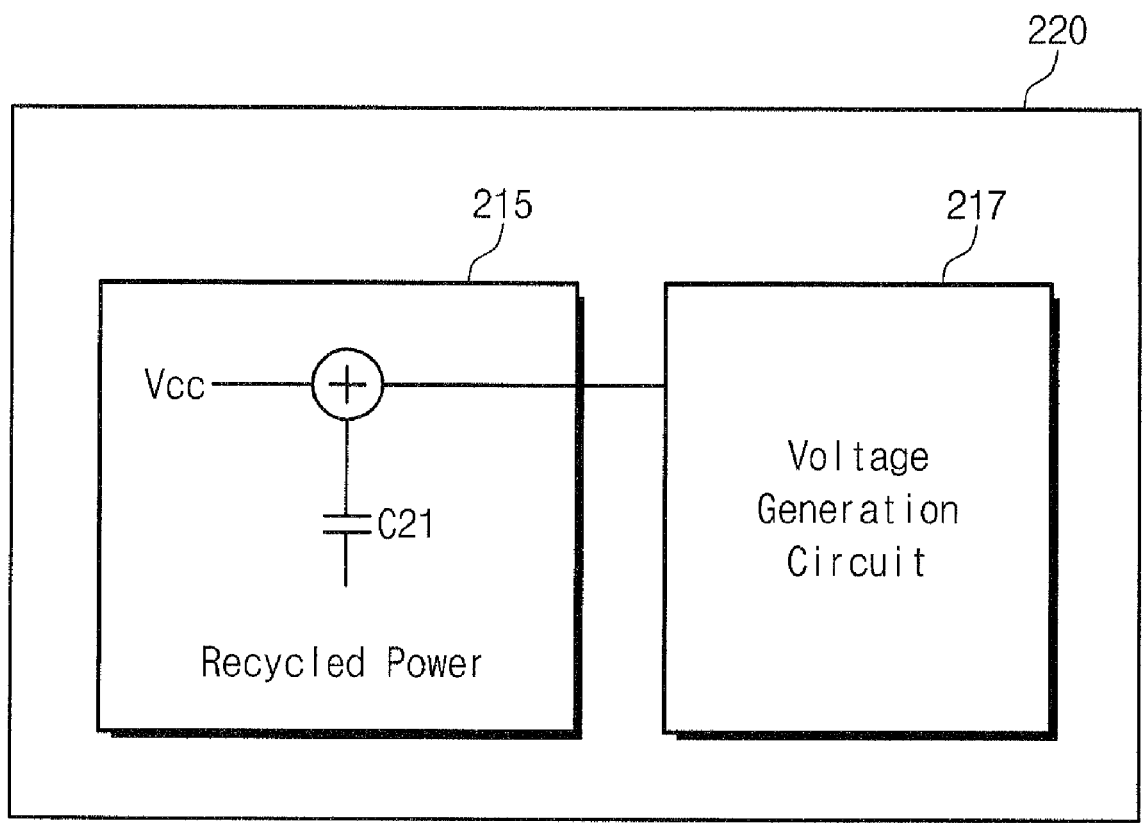
FIG. 8 illustrates the configuration of a voltage generator of a flash memory device according to an exemplary embodiment of the inventive concept.

FIG. 8 illustrates the configuration of a voltage generator 220 of a flash memory device according to an exemplary embodiment of the inventive concept. As illustrated, the voltage generator 220 is connected to a power supply line (e.g., 720 in FIG. 2) and incldues a power input circuit 215 and a voltage generation circuit 217. The power input circuit 215 includes a capacitor C21 connected to the power supply line (e.g., 720 in FIG. 2). The capacitor C21 may store recycled charges provided at the power supply line (e.g., 720 in FIG. 2).

The power input circuit 215 receives a power supply voltage $V_{CC}$ and a recycled power supplied from a charge recycler (e.g., 800 in FIG. 1) through a power supply line (e.g., 720 in FIG. 2). The received two powers are supplied to the voltage generation circuit 217 and used as a power for generating a bias voltage. In other words, the voltage generator 220 generates a bias voltage by using a power supply voltage $V_{CC}$ and a recycled power emitted from the charge recycler 800 in compliance with the control of a flash control logic (e.g., 210 in FIG. 2).

Figure 9:
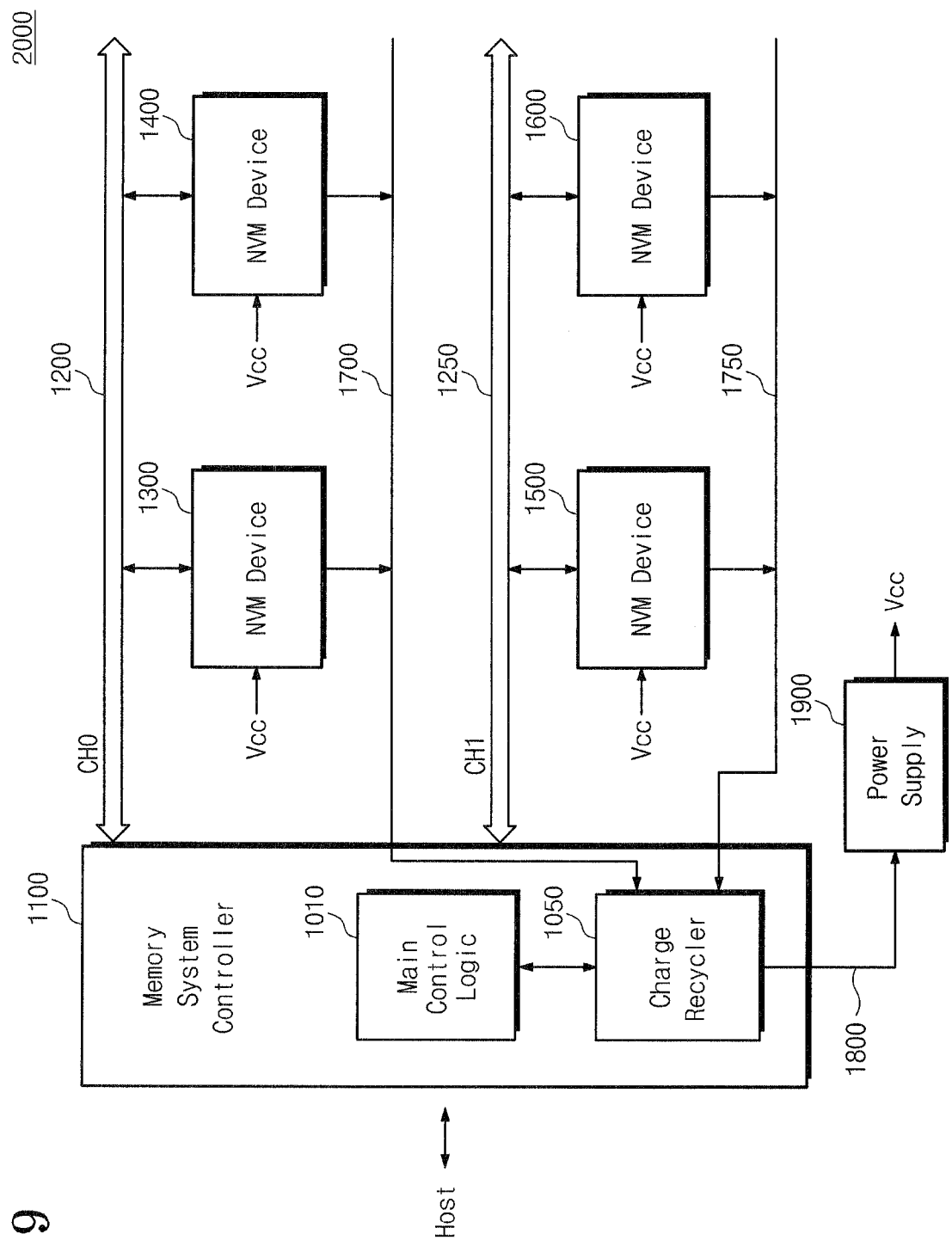
FIG. 9 illustrates the configuration of a nonvolatile memory system according to an exemplary embodiment of the inventive concept.

FIG. 9 illustrates the configuration of a nonvolatile memory system 2000 according to an exemplary embodiment of the inventive concept. As illustrated, the nonvolatile memory system 2000 includes a memory system controller 1100, a plurality of channels 1200 and 1250, a plurality of nonvolatile memory devices 1300, 1400, 1500, and 1600, charge collecting lines 1700 and 1750, a charge supply line 1800, and a power supply 1900. Except for the memory system controller 1100, the charge recycling lines 1700 and 1750, the charge supply line 1800, and the power supply 1900, the other components in FIG. 9 may be identical to those shown in FIG. 1 and will not be described for brevity.

The flash memories 1300 and 1400 are connected to the charge collecting line 1700, and the flash memories 1500 and 1600 are connected to the charge collecting line 1750. The charge collecting lines 1700 and 1750 may comprise a plurality of lines. Charges discharged from bitlines of the flash memories 1300 and 1400 are transferred to a charge recycler 1050 through the charge collecting line 1700. Charges discharged from bitlines of the flash memories 1500 and 1600 are transferred to the charge recycler 1050 through the charge collecting line 1750. The charge supply line 1800 is connected to the power supply 1900. Charges recycled at the charge recycler 1050 are transferred to the power supply 1900 of the memory system 2000 through the charge supply line 1800.

The memory system controller 1100 includes a main control logic 1010 and the charge recycler 1050. The main control logic 1010 controls the memory system 2000 to execute a command (e.g., reading or writing data) requested from a host system. Typically, the main control logic 1010 drives firmware to control the memory system 2000. The main control logic 1010 controls the flash memories 1300 and 1400 or the flash memories 1500 and 1600 such that they perform a write operation. The main control logic 1010 controls the charge recycler 1050 to charge discharged charges that are released after a write operation is completed. The main control logic 1010 controls the charge recycler 1050 to provide the charged charges to the power supply 1900 of the nonvolatile memory system 2000.

The charge recycler 1050 may be organized with the same structure as described above in an exemplary embodiment of the inventive concept. The charge recycler 1050 charges discharged charges (e.g., negative charges) input through the charge collecting lines 1700 and 1750 in compliance with the control of the main control logic 1010. The charge recycler 1050 provides the charged charges to the power supply 1900 of the nonvolatile memory system 2000 in compliance with the control of the main control logic 1010.

The power supply 1900 supplies a power required for operating the memory system 2000 by using a power supplied from a host system and a recycled power supplied from the charge recycler 1050. For example, the power supply 1900 receives a power supply voltage $V_{CC}$ from a host system. In addition, the power supply 1900 receives charges recycled at the charge recycler 1050 through the charge supply line 1800. In other words, the power supply 1900 receives a recycled power. The power supply 1900 supplies a power supply voltage $V_{CC}$ required for operating the flash memories 1300, 1400, 1500, and 1600 by combining the supplied power voltage $V_{CC}$ with the recycled power. Alternatively, the power supply 1900 supplies a power supply voltage $V_{CC}$ required for operating respective elements of the memory system 2000.

Figure 10:
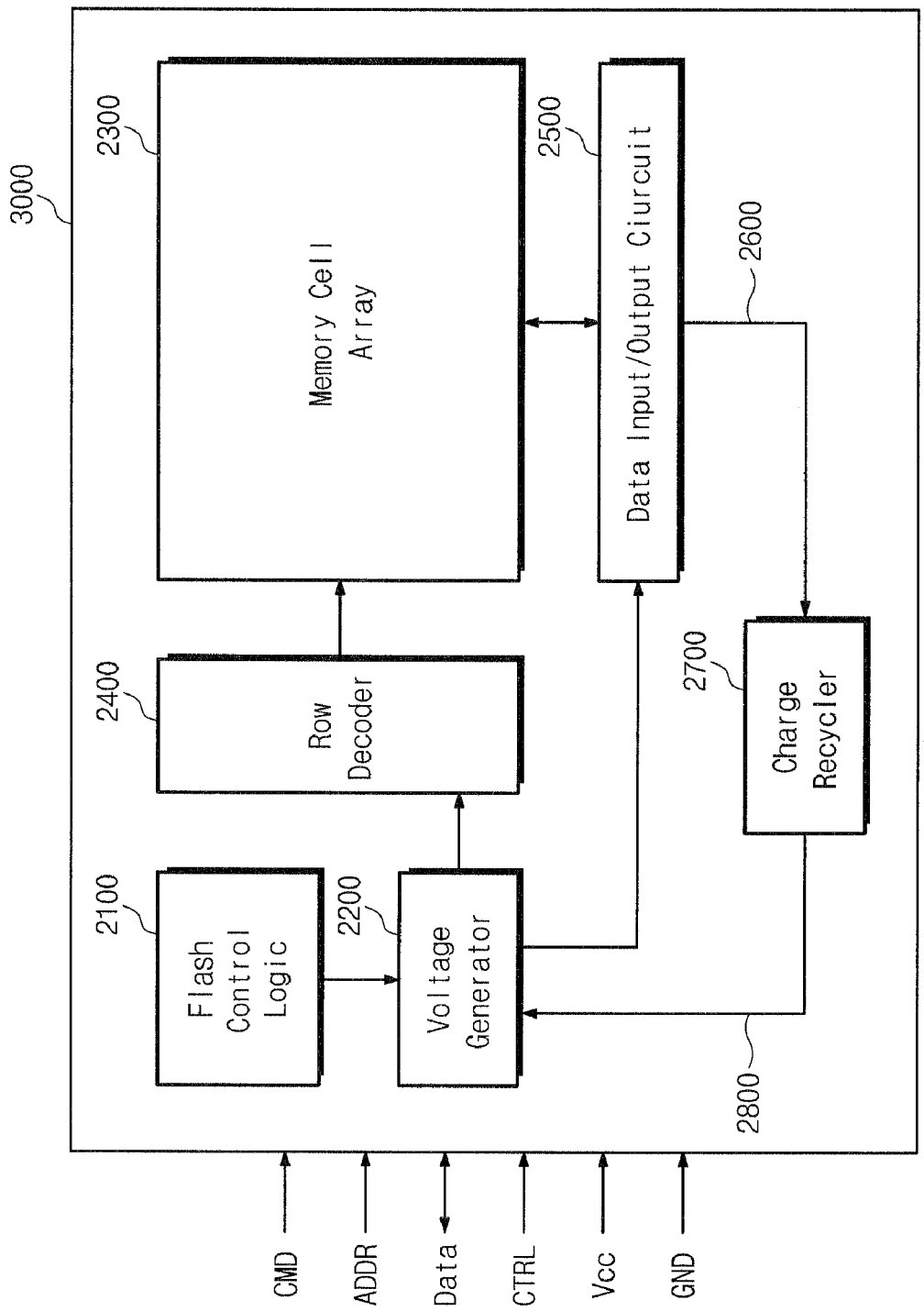
FIG. 10 is a block diagram of a nonvolatile memory system according to an exemplary embodiment of the inventive concept.

FIG. 10 is a block diagram of a nonvolatile memory system 3000 according to an exemplary embodiment of the inventive concept. As illustrated, the nonvolatile memory system 3000 includes a flash control logic 2100, a voltage generator 2200, a memory cell array 2300, a row decoder 2400, a data input/output circuit 2500, a charge collecting line 2600, a charge recycler 2700, and a charge supply line 2800. Except for the charge collecting line 2600, the charge recycler 2700, and the charge supply line 2800, the other components in FIG. 10 may be identical to those described with reference to FIG. 2 and will not be described for brevity.

The charge collecting line 2600 is connected to the data input/output circuit 2500. Charges discharged from a bitline of the memory cell array 2300 are transferred to the charge recycler 2700 through the charge collecting line 2600. The charge supply line 2800 is connected to the voltage generator 2200. Charges recycled at the charge recycler 2700 are transferred to the voltage generator 2200 through the charge supply line 2800.

The charge recycler 2700 is included inside the nonvolatile memory system 3000, wherein element 3000 may be a flash memory. The charge recycler 2700 charges the charges discharged from a bitline through the data input/output circuit 2500 in compliance with the control of the flash control logic 2100. The charge recycler 2700 provides the charged charges to the voltage generator 2200 of the flash memory 3000 through the charge supply line 2800 in compliance with the control of the flash control logic 2100. The voltage generator 2200 generates a bias voltage by using a power supply voltage $V_{CC}$ and a recycled power provided by the charge recycler 2700 in compliance with the control of the flash control logic 2100.

Figure 11:
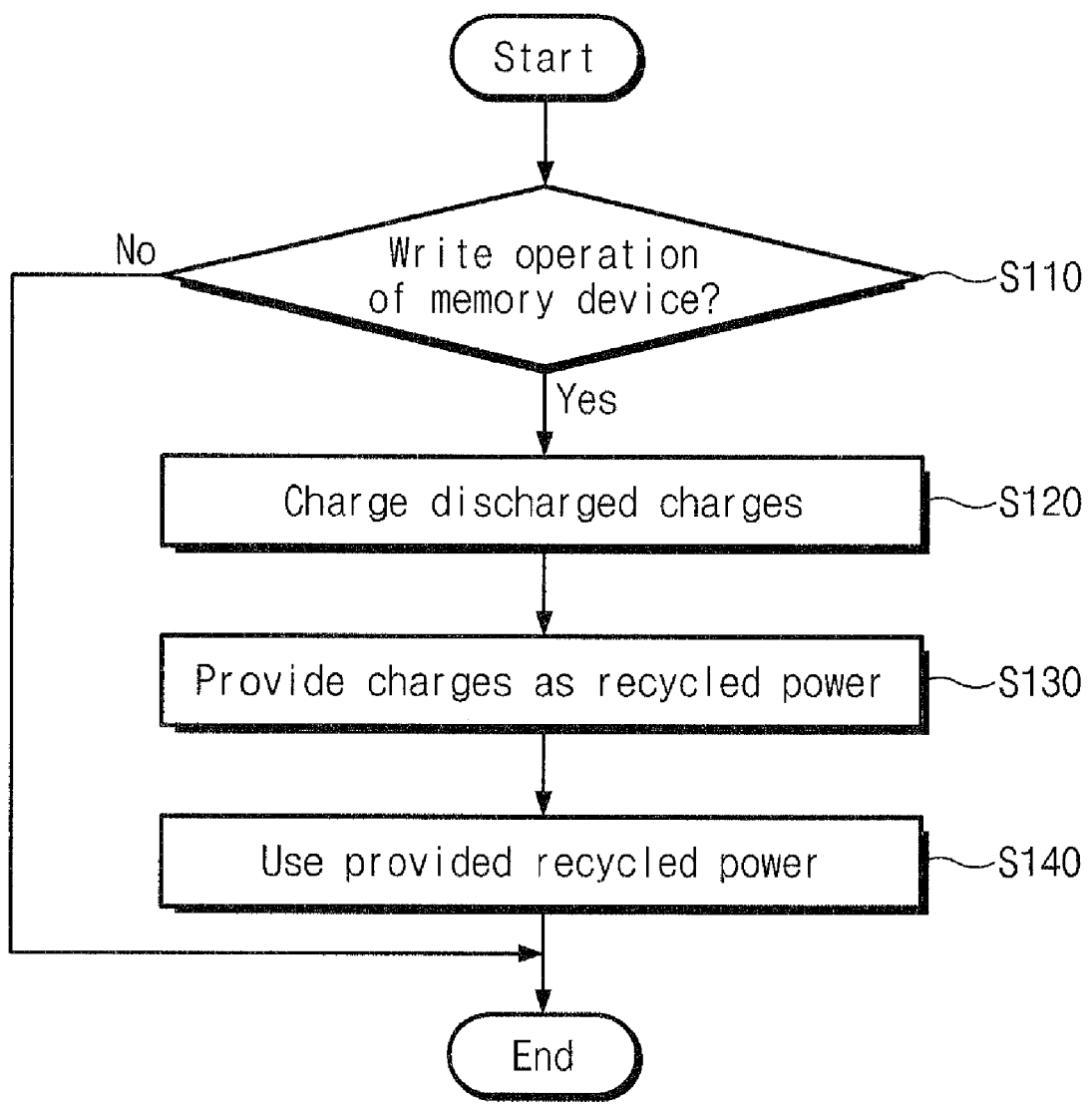
FIG. 11 is a flowchart illustrating the operation of a nonvolatile memory system according to an exemplary embodiment of the inventive concept.

FIG. 11 is a flowchart illustrating the operation of a nonvolatile memory system according to an exemplary embodiment of the inventive concept.

Referring to FIG. 11, a memory system controller controls a memory device such that the memory device performs a write operation (S110). The memory system controller controls a charge recycler to charge charges discharged from the memory device (S120). The charge recycler provides the charged charges as recycled power to components of a nonvolatile memory system in compliance with the control of the memory system controller (S130). The components receiving the charged charges include the memory device or a power supply of the nonvolatile memory system. The components receiving the charged charges reuse the provided recycled power (S140). In an exemplary embodiment of the inventive concept, the nonvolatile memory system is configured to recycle charges discharged during a write operation of the memory device. However, it will be understood that the inventive concept is not limited to the recycling of charges discharged during the write operation of the memory device. For example, the nonvolatile memory system may be configured to recycle charges discharged during read and/or erase operations of the memory device.

In an exemplary embodiment of the inventive concept, the memory system controller selectively controls a discharge circuit included in a data input/output circuit to release charges discharged from a bitline to a charge collecting line. The charge recycler charges the charges provided through the charge collecting line in compliance with the control of the memory system controller. In addition, the charge recycler provides the charged charges as recycled power through the charge supply line in compliance with the control of the memory system controller. The recycled charges are provided to a component (e.g., flash memory) of the nonvolatile memory system to be reused as a working power. Thus, power consumption of the nonvolatile memory system may be reduced. For example, the recycled charges may be provided to a voltage generator of the flash memory to be reused when a bias voltage is generated. Thus, power consumption of the flash memory may be reduced.

Figure 12:
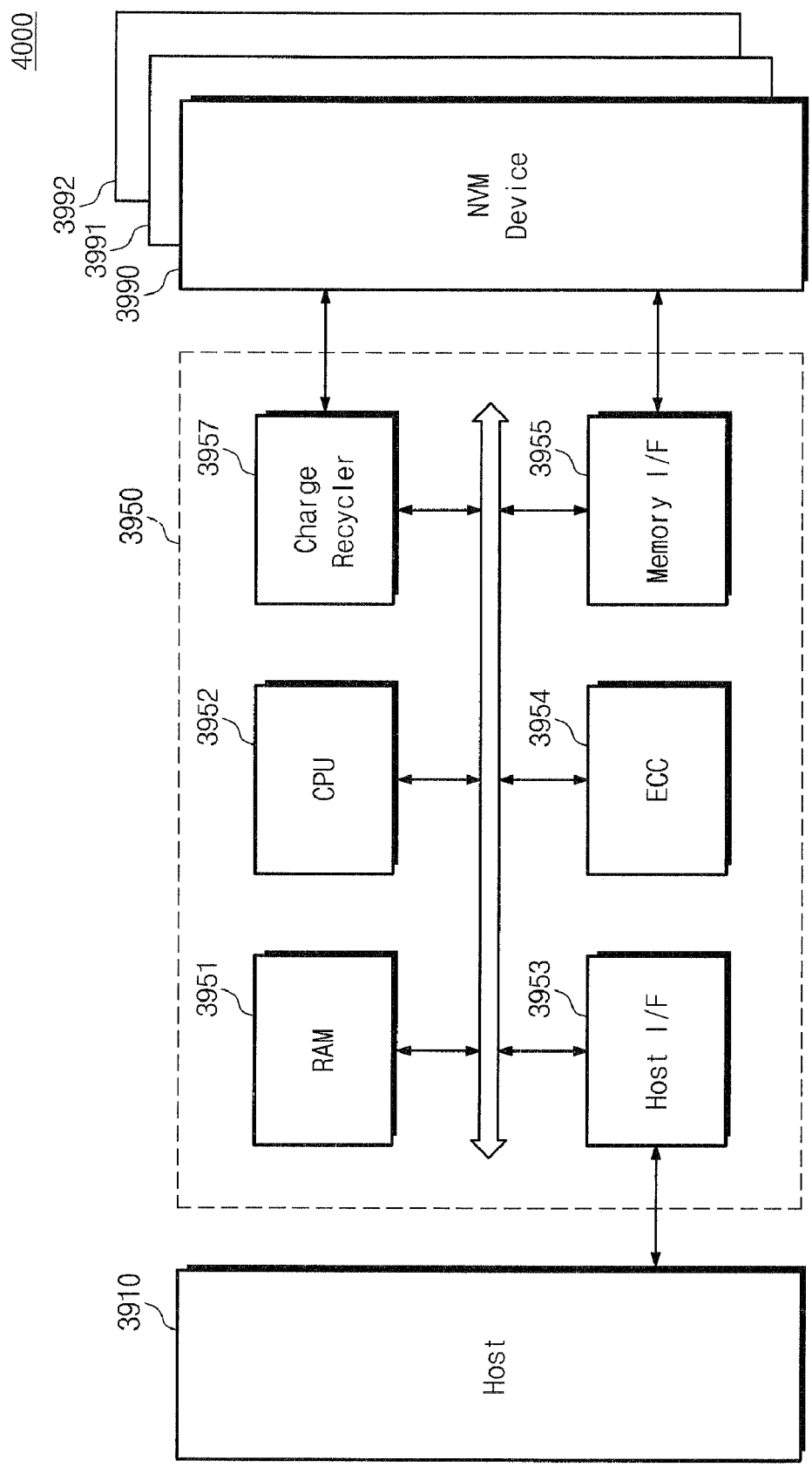
FIG. 12 is a block diagram of a memory system including a flash memory device according to an exemplary embodiment of the inventive concept.

FIG. 12 is a block diagram of a memory system 4000 including a flash memory device according to an exemplary embodiment of the inventive concept. As illustrated, the memory system 4000 may include a memory controller 3950 and nonvolatile memory devices 3990, 3991, and 3992.

The memory controller 3950 is connected to a host 3910 and the nonvolatile memory devices 3990, 3991, and 3992. In response to a request from the host 3910, the memory controller 3950 is configured to access the nonvolatile memory devices 3990, 3991, and 3992. For example, the memory controller 3950 is configured to control read, write, and erase operations of the nonvolatile memory devices 3990, 3991, and 3992. In addition, the memory controller 3950 controls a charge recycler 3957 to recycle charges discharged from bitlines of the nonvolatile memory devices 3990, 3991, and 3992. The memory controller 3950 is configured to provide an interface between the nonvolatile memory devices 3990, 3991, and 3992 and the host 3910. The memory controller 3950 is configured to drive firmware for controlling the nonvolatile memory devices 3990, 3991, and 3992. The memory controller 3950 may include components such as a random access memory (RAM) 3951, a central processing unit (CPU) 3952, a host interface 3953, an error correction code (ECC) 3954, and a memory interface 3955. Further, the memory controller 3950 may include the charge recycler 3957.

The RAM 3951 may be used as a working memory of the CPU 3952. The CPU 3952 controls an overall operation of the memory controller 3950.

The host interface 3953 may include a protocol for data exchange between the host 3910 and the memory controller 3950. For example, the controller 3950 may be configured to communicate with an external host through various interface protocols such such as a universal serial bus (USB) protocol, a multimedia card (MMC) protocol, a peripheral component interconnect (PCI) protocol, a PCI-express (PCI-E) protocol, an advanced technology attachment (ATA) protocol, a serial ATA (SATA) protocol, a parallel ATA (PATA) protocol, a small computer small interface (SCSI) protocol, an enhanced small disk interface (ESDI) protocol, an integrated drive electronics (IDE) protocol, and the like.

The ECC 3954 may be configured to detect errors in data read from the nonvolatile memory devices 3990, 3991, and 3992 and correct the detected errors. As an example, the ECC 3954 may be provided as an element of the memory controller 3950. The memory interface 3955 may interface with the nonvolatile memory devices 3990, 3991, and 3992. The charge recycler 3957 may charge charges discharged from the nonvolatile memory devices 3990, 3991, and 3992 and provide the charged charges as a recycled power. Although not shown in FIG. 12, it will be understood that the memory system 4000 may be provided with a read only memory (ROM) that stores code data for interfacing with the host 3910.

The memory controller 3950 and the nonvolatile memory devices 3990, 3991, and 3992 may be integrated into a single semiconductor device to constitute a memory card. For example, memory controller 3950 and the nonvolatile memory devices 3990, 3991, and 3992 may be integrated into a semiconductor device to constitute a memory card such as a personal computer memory card international association (PCMCIA) card, a compact flash (CF) card, a smart media card, a memory stick, a multimedia card (MMC), reduced-size (RS)-MMC, MMC-micro), a secure digital ((SD), mini SD, micro SD, SD high-capacity (HC)) card, a universal flash storage (UFS) card, and the like.

As another example, the memory system 4000 may be applied a solid state drive (SSD), a computer, a mobile computer, an ultra mobile PC (UMPC), a workstation, a net-book, a personal digital assistant (PDA), a web tablet, a wireless phone, a mobile phone, a digital camera, a digital audio recorder, a digital audio player, a digital video recorder, a digital video player, a device capable of transmitting and receiving information in a wireless environment, one of various electronic devices constituting part of a home network, one of various electronic devices constituting part of a computer network, one of various electronic devices constituting part of a telematics network, a radio frequency identification device (RFID) or an embedded system.

As another example, the nonvolatile memory devices 3990, 3991, and 3992 or the memory system 4000 may be packaged using various types of packages. For example, the nonvolatile memory devices 3990, 3991, and 3992 or the memory system 4000 may be packaged using packages such as Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (PMQFP), Thin Quad Flatpack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), Wafer-Level Processed Stack Package (WSP), and the like.

In an exemplary embodiment of the inventive concept, a memory system is configured to recover and recycle discharged charges. Thus, power consumption of the memory system can be reduced.

While the inventive concept has been particularly shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A memory system, comprising:
    a nonvolatile memory device;
    a charge recycler configured to discharge charges from the nonvolatile memory device and recycle the discharged charges; and
    a controller configured to control the nonvolatile memory device and the charge recycler,
    wherein the controller controls the charge recycler to recycle the discharged charges, wherein during the recycling the charge recycler charges the charges discharged from the nonvolatile memory device, wherein the charges are discharged after a program operation of the nonvolatile memory device is completed.

2. The memory system as set forth in claim 1, wherein the nonvolatile memory device comprises:
    a plurality of memory cells;
    a data input/output circuit connected to the memory cells through a bitline; and
    a control logic configured to control the data input/output circuit such that charges precharged to the bitline are discharged to the charge recycler.

3. The memory system as set forth in claim 2, wherein the data input/output circuit comprises:
    a precharge circuit configured to precharge the bitline; and
    a discharge circuit configured to discharge the bitline.

4. The memory system as set forth in claim 3, wherein the bitline is precharged with a predetermined voltage through the precharge circuit during the program operation of the nonvolatile memory device, the bitline being selected according to data input to the data input/output circuit.

5. The memory system as set forth in claim 1, wherein the charges discharged from the nonvolatile memory device are transferred to the charge recycler through a charge collecting line.

6. The memory system as set forth in claim 1, wherein a charging operation of the charge recycler is started before the program operation of the nonvolatile memory device is completed.

7. The memory system as set forth in claim 1, wherein a voltage supplied from the charge recycler is greater than a discharge voltage of the nonvolatile memory device.

8. The memory system as set forth in claim 1, wherein the charged charges are provided to the nonvolatile memory device through a charge supply line.

9. The memory system as set forth in claim 1, wherein the nonvolatile memory device includes a voltage generator, the voltage generator applying a voltage to a wordline or a bitline of the nonvolatile memory device by using the charged charges provided from the charge recycler.

10. The memory system as set forth in claim 1, further comprising:
    a power supply,
    wherein the charged charges are provided to the power supply from the charge recycler through a charge supply line.

11. The memory system as set forth in claim 1, wherein the memory system is included in a solid state drive (SSD) including a plurality of nonvolatile memory devices.

12. The memory system as set forth in claim 1, wherein the nonvolatile memory device includes a floating gate.

13. A method of recycling charges in a memory system, the memory system including nonvolatile memory devices, a charge recycler, and a controller configured to control the nonvolatile memory devices and the charge recycler, the method comprising:
    performing operations with the nonvolatile memory devices;
    collecting and charging, at the charge recycler, charges discharged from the nonvolatile memory devices; and
    providing, from the charge recycler, the charged charges to the nonvolatile memory devices,
    wherein collecting charges discharged from the nonvolatile memory devices is started before the operations involving the nonvolatile memory devices are completed.

14. The method as set forth in claim 13, wherein the nonvolatile memory devices discharge charges that were precharged thereto to an external entity of the nonvolatile memory devices during a program operation.

15. The method as set forth in claim 13, wherein the charged charges are provided to a nonvolatile memory device that discharged charges that were precharged thereto.

16. The method as set forth in claim 13, wherein a nonvolatile memory device that discharged charges that were precharged thereto is different from a nonvolatile memory device to which the charged charges are provided.

17. The method as set forth in claim 13, wherein the charged charges are provided to a power supply of the memory system.

18. A nonvolatile memory system, comprising:
    a plurality of flash memory devices each including a memory cell array;
    a charge recycler connected to the flash memory devices, the charge recycler including a plurality of capacitors configured to store charges released from unselected bit lines of the flash memory devices, the unselected bit lines being those not involved in a read, write or erase operation performed by the flash memory devices, the charge recycler further including a plurality of transistors respectively coupled to the capacitors, the transistors configured to cause the stored charges to be released from the capacitors; and
    a voltage generator included in each of the flash memory devices, the voltage generator configured to receive the charges released from the capacitors and use the received charges in conjunction with a power supply voltage to generate a bias voltage to be provided to a bit line or word line of the memory cell arrays.

* * * * *